US009484487B2

(12) United States Patent
Masolin et al.

(10) Patent No.: US 9,484,487 B2
(45) Date of Patent: Nov. 1, 2016

(54) METHOD FOR FABRICATING THIN PHOTOVOLTAIC CELLS

(71) Applicants: IMEC, Leuven (BE); Katholieke Universiteit Leuven, Leuven (BE)

(72) Inventors: Alex Masolin, Leuven (BE); Maria Recaman Payo, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 339 days.

(21) Appl. No.: 13/781,417

(22) Filed: Feb. 28, 2013

(65) Prior Publication Data
US 2013/0240030 A1 Sep. 19, 2013

Related U.S. Application Data

(63) Continuation of application No. PCT/EP2011/065813, filed on Sep. 13, 2011.

(60) Provisional application No. 61/382,439, filed on Sep. 13, 2010.

(51) Int. Cl.
H01L 31/18 (2006.01)

(52) U.S. Cl.
CPC ....... *H01L 31/1896* (2013.01); *H01L 31/1804* (2013.01); *Y02E 10/547* (2013.01); *Y02P 70/521* (2015.11)

(58) Field of Classification Search
CPC .................. H01L 21/76229; H01L 21/76232; H01L 31/03529; H01L 31/1804; H01L 21/31666; H01L 21/31679; H01L 21/3205; H01L 21/32056; H01L 21/0256
USPC ............ 257/439, E31.11, 750, 773, E21.09; 438/458, 478, 57
See application file for complete search history.

(56) References Cited

U.S. PATENT DOCUMENTS

2005/0279530 A1* 12/2005 Kirby ................. G01R 1/07357
174/267
2007/0249140 A1* 10/2007 Dross ...................... H01L 21/30
438/458

(Continued)

FOREIGN PATENT DOCUMENTS

| EP | 0797258 | 9/1997 |
| EP | 0993029 A2 | 4/2000 |
| EP | 1220330 A1 | 7/2002 |

OTHER PUBLICATIONS

Kurt Mueller, "Simulation in Photovoltaics: From Solar Cells to Full-Scale Arrays," May 2010, Solar Industry, vol. 1, Issue 10.*
International Search Report for International application No. PCT/EP2011/065813 dated Jan. 16, 2012 by European Patent Office.
Reuter M et al., "50mum thin solar cells with 17.0% efficiency", Solar Energy Materials and Solar Cells, Elsevier Science Publishers, Amsterdam, NL, vol. 93, No. 6-7, Jun. 1, 2009, pp. 704-706.

(Continued)

*Primary Examiner* — Kenneth Parker
*Assistant Examiner* — Bo Fan
(74) *Attorney, Agent, or Firm* — Knobbe Martens Olson & Bear LLP

(57) ABSTRACT

A method for fabricating thin crystalline photovoltaic cells is disclosed. In one aspect, the method includes: forming a weakening layer in a surface portion of a semiconductor substrate; epitaxially growing a stack of semiconductor layers on the substrate for forming an active layer of the photovoltaic cell, the stack having a first thermal coefficient of expansion; providing on the stack patterned contact layer for forming electrical contacts of the photovoltaic cell, the patterned contact layer having a second thermal coefficient of expansion different from the first thermal coefficient of expansion. The process of providing a patterned contact layer simultaneously induces a tensile stress in the weakening layer, resulting in a lift-off from the substrate of a structure including the stack of semiconductor layers and the patterned contact layer.

20 Claims, 5 Drawing Sheets

(56) References Cited

U.S. PATENT DOCUMENTS

| | | | |
|---|---|---|---|
| 2008/0179547 A1* | 7/2008 | Henley | H01L 21/76254 250/492.21 |
| 2010/0031994 A1* | 2/2010 | Varghese | H01L 31/022425 136/244 |
| 2010/0203711 A1* | 8/2010 | Wang | H01L 21/76229 438/478 |

OTHER PUBLICATIONS

Solanki C S et al., "Transfer of a thin silicon film on to a ceramic substrate", Thin solid films, Elsevier-Sequoia S.A. Lausanne, CH, vol. 403-404, Feb. 1, 2002, pp. 34-38.

Wolf et al., "Formation of Phosphorus Emitters in Crystalline Silicon Thin-Film Solar Cells by the Novel Autodiffusion Process", 21$^{st}$ European Photovoltaic Solar Energy Conference, Sep. 4-8, 2006, Dresden, Germany, pp. 730-733.

* cited by examiner

METHOD FOR FABRICATING THIN PHOTOVOLTAIC CELLS

CROSS REFERENCE TO RELATED APPLICATIONS

This application is a continuation of PCT Application No. PCT/EP2011/065813, filed Sep. 13, 2011, which claims priority under 35 U.S.C. §119(e) to U.S. provisional patent application 61/382,439 filed on Sep. 13, 2010. Each of the above applications is incorporated herein by reference in its entirety.

BACKGROUND OF THE INVENTION

1. Field of the Invention

The disclosed technology relates to methods for fabricating thin epitaxial photovoltaic cells.

2. Description of the Related Technology

In order to reduce the costs of crystalline silicon photovoltaic cells, the material consumption of highly pure silicon in a typical photovoltaic cell structure is preferably reduced. Most of the silicon material merely acts as a mechanical carrier for the photovoltaic cell with most of the optical absorption taking place in the upper 30 micrometer.

One approach to reduce the material consumption of highly pure silicon comprises growing a thin crystalline silicon layer of good quality on a low-cost silicon carrier substrate by means of epitaxial growth, wherein the thin epitaxial layer is the active layer of the photovoltaic cell. The carrier substrate can for example be a low-cost substrate which, because of the doping level and/or the impurity level, does not allow the realization of a photovoltaic cell with good conversion efficiency in the substrate. The carrier substrate mainly provides mechanical stability to the photovoltaic cell. However, the supply of such low-cost substrates is today a bottleneck.

In EP0797258, a method is described for fabricating thin silicon photovoltaic cells, wherein the active layer of the photovoltaic cells is epitaxially grown on a reusable, single crystalline silicon substrate. A multi-layer porous structure including two or more porous layers having different porosities is formed in a surface portion of a crystalline silicon substrate, by means of an anodization process. A thin silicon film is epitaxially grown on the porous structure, the silicon film comprising multiple layers forming a solar cell structure (for example a $p^+$ type layer, a $p^-$ type base layer and an $n^+$ type emitter layer). After providing for example a surface passivation layer and front side metal contacts, a support substrate is bonded onto the solar cell structure. Next an external force (outward pulling) is applied between the support substrate and the silicon substrate, thereby inducing a tensile stress, such that the solar cell structure (including the support substrate) is separated from the silicon substrate along a line of weakness in the porous structure. After that, a metal film is provided on the back surface of the silicon film as a back surface electrode. The silicon substrate can be reused.

SUMMARY OF CERTAIN INVENTIVE ASPECTS

Embodiments of the present invention relate to a method for fabricating thin crystalline photovoltaic cells, wherein the active layer of the photovoltaic cells is epitaxially grown on a substrate and subsequently removed from the substrate such that the substrate can be reused, and wherein the number of process steps is reduced as compared to prior art processes. The active layer of the photovoltaic cells can for example comprise silicon, germanium, silicon germanium or any other suitable semiconductor material, and the reusable substrate can for example be a high-quality semiconductor, e.g. silicon, substrate. The active layer can be of high quality, allowing fabricating photovoltaic cells with good conversion efficiencies.

A first aspect of the present invention relates to a method for fabricating thin crystalline photovoltaic cells, the method comprising: providing a semiconductor substrate; forming a weakening layer at a surface of the substrate; epitaxially growing a stack of semiconductor layers on the substrate for forming an active layer of the photovoltaic cell, the semiconductor layers of the stack having a first thermal coefficient of expansion $TCE_1$; and providing on the stack of semiconductor layers a patterned contact layer for forming electrical contacts of the photovoltaic cell, the patterned contact layer having a second thermal coefficient of expansion $TCE_2$ different from the first thermal coefficient of expansion $TCE_1$. Providing a patterned contact layer simultaneously induces a tensile stress in the weakening layer, resulting in a separation or lift-off from the substrate of a structure comprising the stack of semiconductor layers and the patterned contact layer. Providing a patterned contact layer may include a step of generating a temperature change, thereby inducing the tensile stress in the weakening layer.

In one inventive aspect, the step of providing a patterned contact is used for inducing tensile stress in the weakening layer resulting in a lift-off from the substrate of a structure comprising the stack of semiconductor layers and the patterned contact layer. Thereto, in embodiments of the present invention, the provided layer sequence in the stack is inverted compared to prior art methods. This means that in embodiments of the present invention first the top layer of the solar cell to be formed is provided, whereas in prior art solutions first the back side layer is grown.

It is advantageous that the metal used for lifting-off the stack from the substrate has a function in the solar cells to be formed. This reduces the number of process steps to be applied.

The semiconductor substrate may for example be a high-quality semiconductor, e.g. silicon, substrate that may be reused after lift-off. However, the present invention is not limited thereto and other suitable substrates known to a person skilled in the art may be used.

Forming a weakening layer can for example comprise forming a porous layer at the surface of the substrate. Forming a porous layer can be done by etching, for example by anodization. In particular embodiments the porosity of the porous layer may vary in a thickness direction of the porous layer, with a higher porosity at an interface with the substrate and a lower porosity towards the surface. It is an advantage of such an approach that the higher porosity part allows for a good separation or lift-off in a later stage of the process and that the lower porosity part allows for the growth of an epitaxial stack of semiconductor layers of good quality. For example, the porous layer can have a graded porosity or it can comprise two or more sub-layers with different porosity.

Forming a weakening layer can comprise other suitable processes known to a person skilled in the art, such as for example ion implantation.

Epitaxially growing a stack of semiconductor layers for forming the active layer of the photovoltaic cell can for example comprise growing a first epitaxial layer for forming an emitter layer of the photovoltaic cell, growing a second epitaxial layer for forming a base layer of the photovoltaic cell and growing a third epitaxial layer for forming a back surface field. However, other suitable epitaxial stacks known to a person skilled in the art may be used. For example, e.g. in case of back contact cells, epitaxially growing a stack of semiconductor layers for forming the active layer of the photovoltaic cell can comprise growing a first epitaxial layer for forming a front surface field, growing a second epitaxial layer for forming a base layer and growing a (patterned) third epitaxial layer for forming a back surface field and/or for forming an emitter region of the photovoltaic cell. However, the present invention is not limited thereto and any suitable stack of semiconductor layers forming a photovoltaic cell structure (e.g. active layer) known to a person skilled in the art may be used.

The patterned contact layer may comprise an electrically conductive material such as a metal or a conductive nitride or any other suitable material known to a person skilled in the art. The first thermal coefficient of expansion can be smaller than the second thermal coefficient of expansion, or vice versa, the second thermal coefficient of expansion can be smaller than the first thermal coefficient of expansion. In one embodiment, the patterned contact layer comprises a screen printed metal layer. In such embodiments, generating a temperature change may comprise performing a metal firing step. The metal firing step may for example be performed at a temperature in the range between about 700° C. and 950° C. In particular embodiments the patterned contact layer may be a screen printed Aluminum layer, wherein the Aluminum layer is used for contact formation, for BSF formation and for inducing lift-off.

In one embodiment, the method may further comprise, after lift-off, additional process steps to finalize the photovoltaic cells, such as for example texturization, surface passivation, deposition of an antireflective coating, or providing front side electrical contacts.

It is an advantage of a method according to one aspect that the substrate on which an epitaxial stack is grown can be reused. This allows using higher-quality substrates and thus growing higher-quality epitaxial layers as compared to some prior art processes, without negatively affecting the cost of the photovoltaic cells. A higher-quality epitaxial layer may result in a higher conversion efficiency of the photovoltaic cells, thereby relaxing the cost constraints.

It is an advantage of a method according to one aspect that the number of process steps is reduced as compared to prior art methods. For example, the steps of providing a patterned contact layer on the epitaxial stack and generating a temperature change are used for providing metal contacts to the photovoltaic cell and in addition for inducing stress in the weakening layer, leading to separation of the structure from the substrate such that the need for providing an external pulling force can be avoided. The same steps can in addition be used for forming a highly doped region, e.g. a back surface field (BSF) region.

Certain objects and advantages of some inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the invention. The invention, both as to organization and method of operation, together with features and advantages thereof, may best be understood by reference to the following detailed description when read in conjunction with the accompanying drawings.

Figure 1:
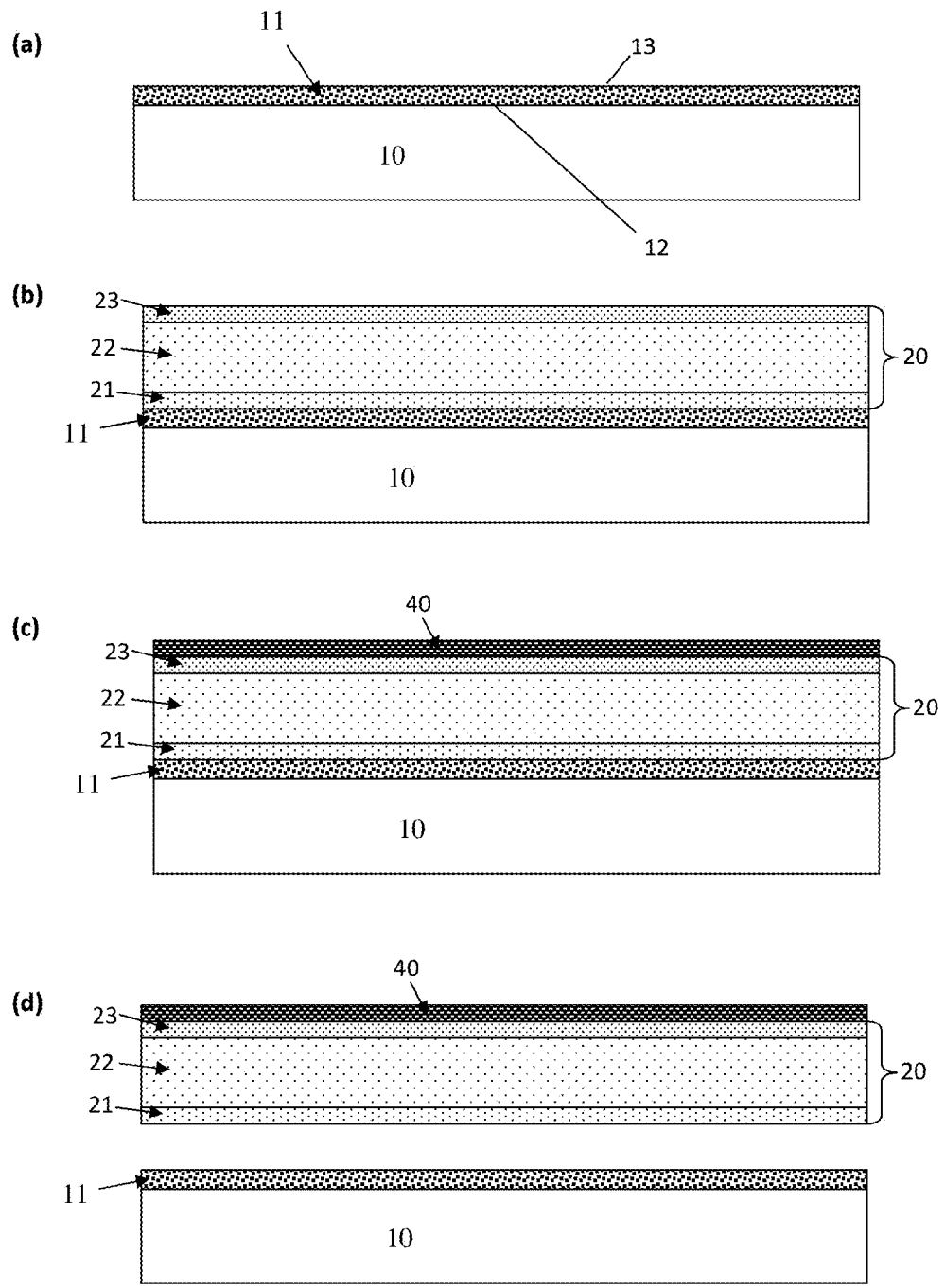
FIG. 1 schematically illustrates a method for fabricating thin semiconductor photovoltaic cells according to an embodiment of the present invention.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the invention and how it may be practiced in particular embodiments. However, it will be understood that the present invention may be practiced without these specific details. In other instances, well-known methods, procedures and techniques have not been described in detail, so as not to obscure the present invention. While the present invention will be described with respect to particular embodiments and with reference to certain drawings, the invention is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The front surface or front side of a photovoltaic cell is the surface or side adapted for being oriented towards a light source and thus for receiving illumination. The back surface, also called back side, rear surface or rear side of a photovoltaic cell is the surface or side opposite to the front surface.

A high-quality semiconductor, e.g. silicon, substrate is a crystalline (preferably monocrystalline) semiconductor, e.g. silicon, substrate having a low impurity content. For example, the surface metal contamination (Cr, Fe, Ni, Cu, Cr, K, Ca, Al, Na . . . ) is preferably substantially lower than about $10^{10}$ at/cm$^2$, the nominal O concentration is preferably lower than about $7.10^{17}$ at/cm$^3$ and the C concentration is preferably lower than about $5.10^{16}$ at/cm$^3$.

An active layer may be an epitaxially grown layer (epi layer). An active layer is considered of high quality if at the interface between that layer and the substrate onto which the active layer is provided, the C concentration is lower than about $1,5.10^{17}$ at/cm$^3$ and the O concentration is lower than about $5.10^{17}$ at/cm$^3$, the surface metal contamination (Cr, Fe, Ni, Cu, Cr, K, Ca, Al, Na . . . ) is substantially lower than about $10^{10}$ at/cm$^2$ and the average defect density is lower than about $10^4$ defects/cm$^2$.

Certain embodiments relate to a method for fabricating thin crystalline (for example monocrystalline or multicrystalline) photovoltaic cells based on epitaxial growth of an active layer on a substrate, followed by removal of the active layer from the substrate such that the substrate can be reused. In a method according to one embodiment, the number of process steps is reduced as compared to prior art methods. In the further description examples are given for silicon photovoltaic cells. However, the method is not limited to silicon photovoltaic cells but can also be used for photovoltaic cells based on other semiconductor materials such as for example SiGe or SiGeSn. The method can also be used for forming thin epitaxial foils for other applications than for photovoltaic cells.

A method for fabricating thin silicon photovoltaic cells, as an example only, according to an embodiment of the present invention is schematically illustrated in FIG. 1.

At a surface of a substrate 10, e.g., a high quality semiconductor silicon substrate such as silicon or a low cost substrate such as a highly doped semiconductor silicon substrate, for example a p+ type substrate with a doping concentration higher than about $5.10^{18}$ cm$^{-3}$, a thin porous layer 11 is formed (FIG. 1(a)) for example by means of an anodization process. During the anodization process, macropores are formed at the surface of the substrate 10. The porous layer 11 may be a thin layer having a thickness of less than 3 micrometer, but the invention is not limited thereto. Any suitable porous layer thickness and any suitable degree of porosity of the porous layer known to a person skilled in the art can be used. The porosity of the porous layer 11 can be substantially the same throughout the layer or it can vary, e.g. in a thickness direction of the porous layer, i.e. in a direction perpendicular to a major surface of the substrate 10 onto which the porous layer is formed. For example, the porous layer 11 can have a graded porosity with a higher porosity at the interface 12 with the substrate 10 and a lower porosity towards the surface 13 of the porous layer away from the interface 12. In particular embodiments, the gradient in porosity from the interface 12 towards the surface 13 can be substantially continuous. In alternative embodiments, the variation in porosity from the interface 12 towards the surface 13 can be stepwise. For example, the porous layer 11 can comprise two or more sub-layers with different porosity, for example the porous layer 11 can comprise (not illustrated in FIG. 1(a)) a first sub-layer with a first porosity and a second sub-layer with a second porosity on top of the first sub-layer, the second porosity being lower than the first porosity. As an example, the porosity of the first sub-layer can be in the range between about 40% and 60% and the porosity of the second sub-layer can be in the range between about 20% and 30%. The lower porosity close to the surface 13, e.g. the lower porosity of the second sub-layer, allows for the growth of an epitaxial layer with good quality in a later stage of the process (as further described). The higher porosity close to the interface 12, e.g. the higher porosity of the first sub-layer, allows for a good separation or lift-off of the epitaxial layer in a later stage of the process (as further described). The first sub-layer can for example have a thickness in the range between about 50 nm and 800 nm, for example between about 200 nm and 600 nm. The second sub-layer can for example have a thickness in the range between about 1000 nm and 1500 nm. However, the present invention is not limited thereto and other sub-layer thicknesses and porosities may be used.

Next a high-temperature (e.g. temperature >about 850° C.) treatment in H$_2$ is performed, resulting in removal of a native oxide and reorganization of the porous semiconductor, e.g. silicon, layer, wherein the porous layer may undergo a structural change into a quasi-crystalline layer with voids.

After the H$_2$ treatment, a stack 20 of semiconductor, e.g. silicon, layers, e.g. at least two layers such as for example at least an n-type layer and a p-type layer forming a p-n-junction, is epitaxially grown on top of the porous layer 11, the stack 20 being provided for forming the active part or active layer of a photovoltaic cell. This is schematically illustrated in FIG. 1(b) for an exemplary embodiment. In this exemplary embodiment, the stack 20 for example comprises a first epitaxial layer 21, a second epitaxial layer 22 and a third epitaxial layer 23 on top of one another. In the final photovoltaic cell which will be produced, the first epitaxial layer 21 is located at the front side of the photovoltaic cell and can be an emitter layer, e.g. an n-type emitter layer or a p-type emitter layer. The second epitaxial layer 22 can be a base layer of the photovoltaic cell, wherein the second epitaxial layer 22 has a doping type opposite to the doping type of the first epitaxial layer 21. The thicknesses of the epitaxial layers 21, 22, 23 are such that the epitaxial layers are suitable for their intended purpose in the final device. The thickness of the second epitaxial layer 22 (base layer) may be less than about 100 micrometer, for example less than about 50 micrometer, such as in the range between about 3 micrometer and 50 micrometer, e.g. between about 5 micrometer and 40 micrometer, for example between about 5 micrometer and 20 micrometer, for example between about 5 micrometer and 10 micrometer. The third epitaxial layer can for example be a thin heavily doped layer having the same doping type as the third epitaxial layer, e.g. being provided for forming a back surface field. In certain embodiments of the present invention the top surface of the epitaxial layer stack 20 corresponds to the back surface of the photovoltaic cell to be formed and the bottom side of the epitaxial layer stack 20 (i.e. the side adjacent to the porous layer 11) corresponds to the front surface of the photovoltaic cell to be formed. This is different from prior art methods, wherein the top surface of the epitaxial layer corresponds to the front surface of the photovoltaic cell.

Although the process illustrated in FIG. 1 is described for the exemplary embodiment wherein a p+ substrate is used on which a p/n/n+ epitaxial stack or an n/p/p+ epitaxial stack is grown, the present invention is not limited thereto. For example, an n+ substrate can be used and/or the epitaxial stack can also comprise more than three epitaxial layers or less than three epitaxial layers. Depending on the final photovoltaic cell structure, other suitable epitaxial stacks can be used, as for example further described and illustrated in FIG. 2.

Further to the embodiment illustrated in FIG. 1, in a subsequent step a contact layer 40 of electrically conductive material, e.g. a metal layer is provided on the epitaxial layer stack 20, as illustrated in FIG. 1(c). The electrically conductive material has a suitable value for the temperature coefficient, a low contact resistance to the semiconductor material, a good electrical conductivity (as this contact material in accordance with certain embodiments of the present invention remains in the solar cell), and a good solderability. The contact layer 40 can be provided by any suitable method known by a person skilled in the art, such as for example screen printing, evaporation or sputtering. Any of these methods inherently lead to a temperature change, resulting in a lift-off of the epitaxial layers in a later stage of the process. In case the contact layer is a metal layer, it is a particularly advantageous embodiment if the metal layer 40 is provided by screen printing, because the metal layer thickness and the higher temperatures used in a screen printing process as compared to other metallization processes may be beneficial for inducing sufficient stress resulting in lift-off of the epitaxial layers in a later stage of the process (as described below). Moreover, in solar cell processing, usually a firing step is performed, at a temperature higher than about 600° C., of more than about 800° C., after providing the metal contacts, in order to improve the contact between the metal and the underlying semiconductor material. Also this temperature step aids in lifting off the epitaxial layer. In the example shown in FIG. 1(c), the metal layer 40 is provided on the third epitaxial layer 23. The metal layer 40 can be a continuous layer, fully covering the epitaxial layer 23 as illustrated in FIG. 1(c). Alternatively, the metal layer 40 can be a patterned metal layer (not illustrated in the drawings). Before providing the contact layer 40, other process steps can be performed, such as for example surface passivation.

Figure 3:
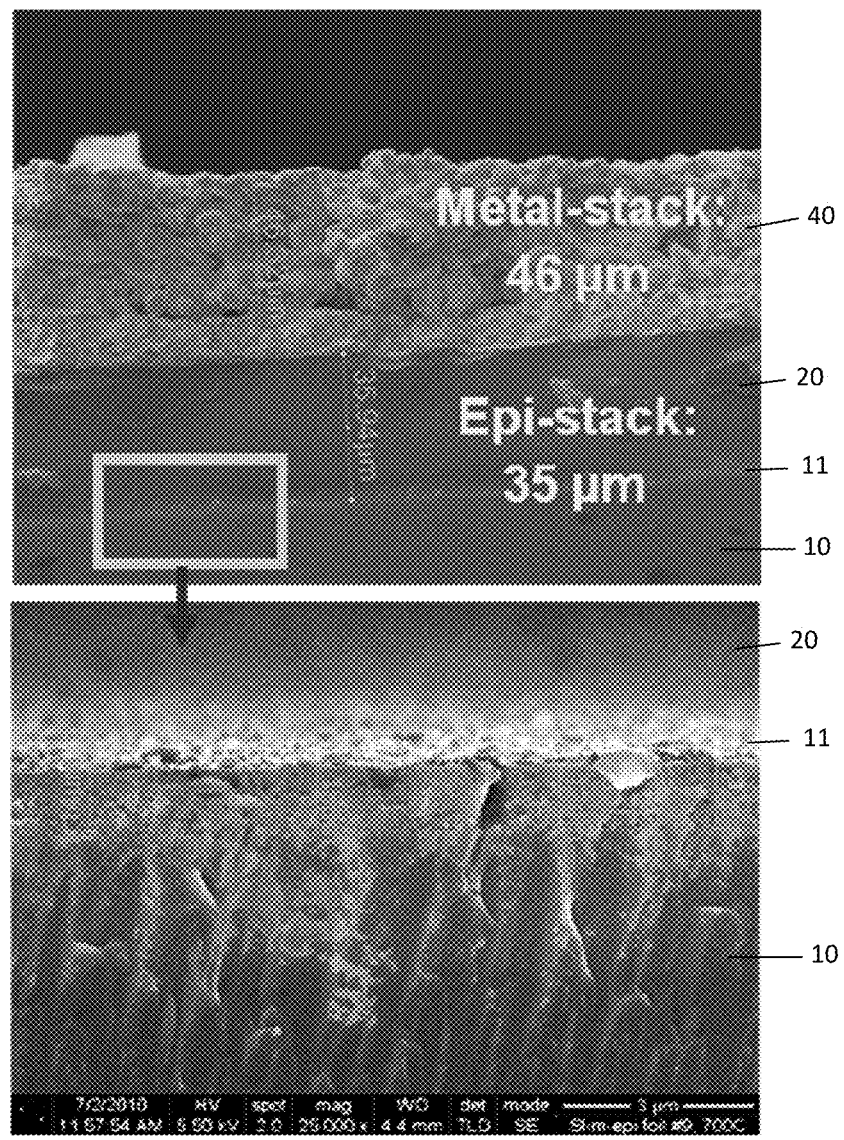
FIG. 3 shows a SEM cross section of a structure fabricated according to one embodiment of a method according to the present invention, before lift-off.

FIG. 3 is a SEM cross section of a structure as shown in FIG. 1(c), illustrating a substrate 10 with a thin porous layer 11 (detail in the lower SEM picture of FIG. 3), a 35 micrometer thick epitaxial layer 20 grown on top of the porous layer 11, and a 46 micrometer thick screen printed metal layer 40 on top of the epitaxial layer 20.

In one embodiment, the epitaxial layer stack 20 has a first thermal coefficient of expansion $TCE_1$ and the contact layer 40 has a second thermal coefficient of expansion $TCE_2$ different from, e.g. larger than or smaller than, the first thermal coefficient of expansion $TCE_1$. Therefore, upon applying a temperature step, e.g. a temperature decrease or a temperature increase, depending on the type of difference between the first thermal coefficient of expansion $TCE_1$ and the second thermal coefficient of expansion $TCE_2$, a tensile stress is induced in the structure. As the porous layer 11 is mechanically the weakest layer of the structure shown in FIG. 1(c), the stress induced by the temperature step causes cracks in the porous layer 11, leading to a separation or lift-off of the epitaxial layer stack 20 (including the contact layer 40) from the substrate 10. This is illustrated in FIG. 1(d). When using a screen printing process for providing the contact layer 40, e.g. metal layer, the temperature step causing lift-off can be the firing step that is part of the screen printing process, wherein a tensile stress is induced in the porous layer 11 during cooling down. It is an advantage of such embodiments that the need for an additional temperature step for inducing lift-off can be avoided, as the required temperature step is inherently present in the processing method.

Although in the example shown FIG. 1(d) an embodiment is shown wherein the separation of the epitaxial stack 20 from the substrate 10 occurs at the interface between the epitaxial stack 20 and the porous layer 11 (wherein the porous layer 11 remains attached to the substrate 10), the separation may also occur at another location, for example between the substrate 10 and the porous layer 11, for example when the porosity is constant throughout the porous layer, or inside the porous layer 11 at a location of highest porosity. In that case a part of the porous layer 11 (for example a part having higher porosity, e.g. a first sub-layer with a first porosity) may remain attached to the substrate 10 and another part of the porous layer 11 (for example a part having lower porosity, e.g. a second sub-layer with a second porosity lower than the first porosity) may be lifted off and may remain attached to the epitaxial stack 20.

Figure 4:
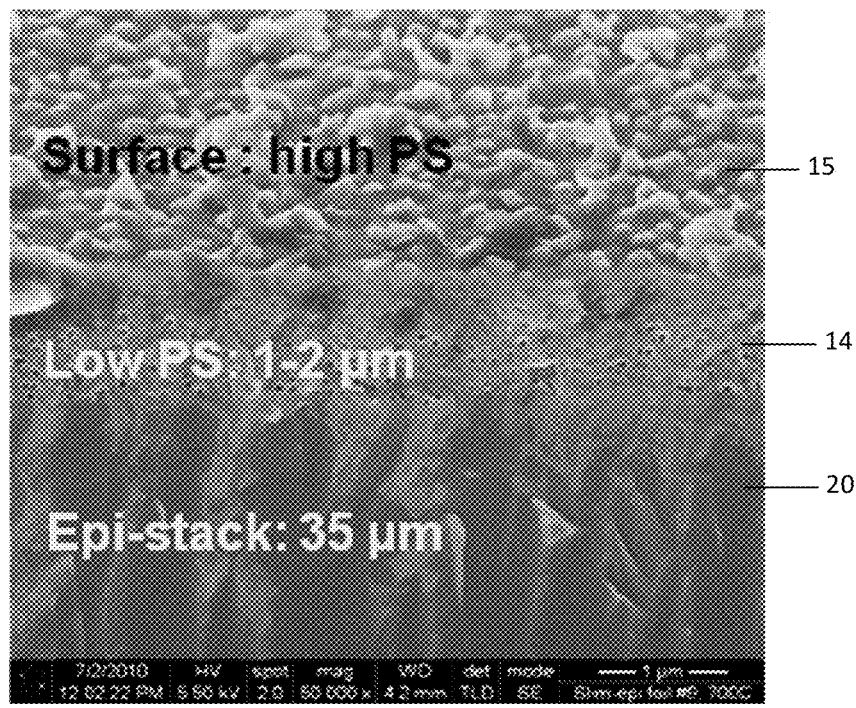
FIG. 4 is a SEM cross section of the structure shown in FIG. 3, after lift-off.

FIG. 4 is a SEM cross section of a structure after lift-off, illustrating an epitaxial stack 20 with a porous layer 11 attached to the epitaxial layer 20, the porous layer 11 comprising a sub-layer 14 with low porosity adjacent to the epitaxial stack 20 and a sub-layer 15 with higher porosity at the surface where the stack is lifted off from the substrate 10.

Figure 5:
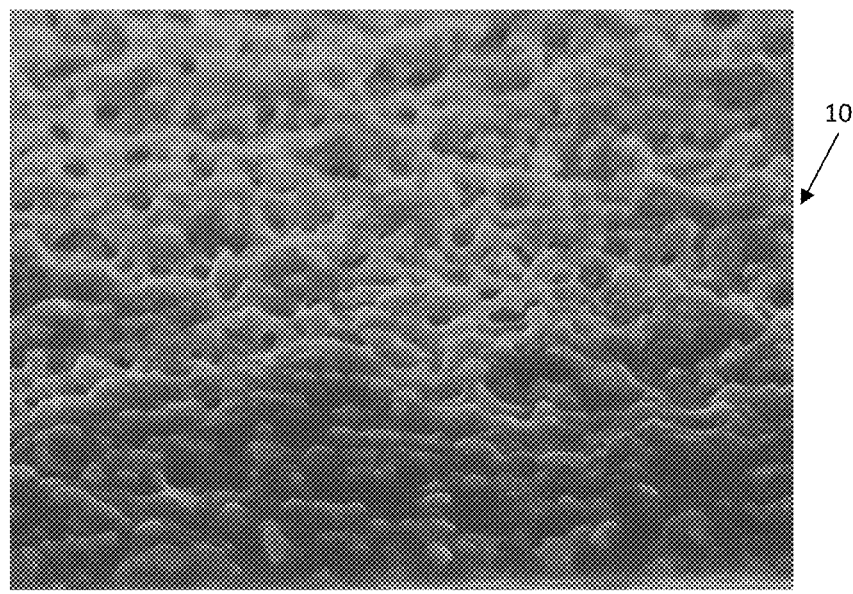
FIG. 5 is a SEM photograph showing a substrate surface after lift-off, for a process using a porous layer comprising a low-porosity sub-layer and a 600 nm thick high-porosity sub-layer.
Figure 6:
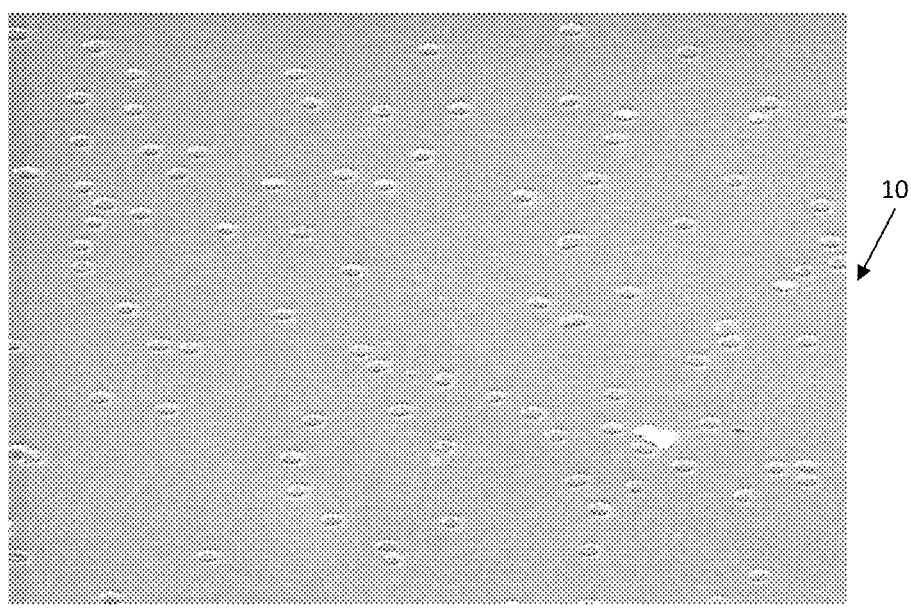
FIG. 6 is a SEM photograph showing a substrate surface after lift-off, for a process using a porous layer comprising a low-porosity sub-layer and a 200 nm thick high-porosity sub-layer.

FIG. 5 and FIG. 6 are SEM photographs of a substrate 10 after lift-off of the epitaxial stack 20. In both cases a porous layer comprising a first sub-layer with a first porosity and a second sub-layer with a second porosity lower than the first porosity was used. In the example shown in FIG. 5, the thickness of the first porosity layer was about 600 nm, while in the example shown in FIG. 6 the thickness of the first porosity layer was about 200 nm. It can be seen that for the thicker high-porosity layer the surface of the substrate 10 after lift-off shows a higher roughness as compared to the example where a thinner high-porosity layer is used. This can be related to a more random crack propagation in the porous layer 11 in case of a thicker high-porosity layer.

The substrate 10 can be reused, e.g. in a process according to one embodiment.

After removing the epitaxial stack 20 (including the conductive contacts 40) from the substrate 10, additional (optional) process steps can be performed to finalize the photovoltaic cell, such as for example removal of remainders of the porous layer 11, front surface texturization, front surface passivation, and/or providing an antireflective coating. In case of front-contact cells, electrical contacts can be provided at the front side, i.e. the side which previously contacted the porous layer 11.

In the above exemplary process according to certain embodiments of the present invention, the process step of forming the back contacts of the photovoltaic cell is simultaneously used to create stress, resulting in lift-off of the epitaxial semiconductor, e.g. silicon, stack 20.

As opposed to prior art methods, the need for providing an external force such as an external pulling force or ultrasonic vibrations is avoided in certain embodiments of the present invention.

Figure 2:
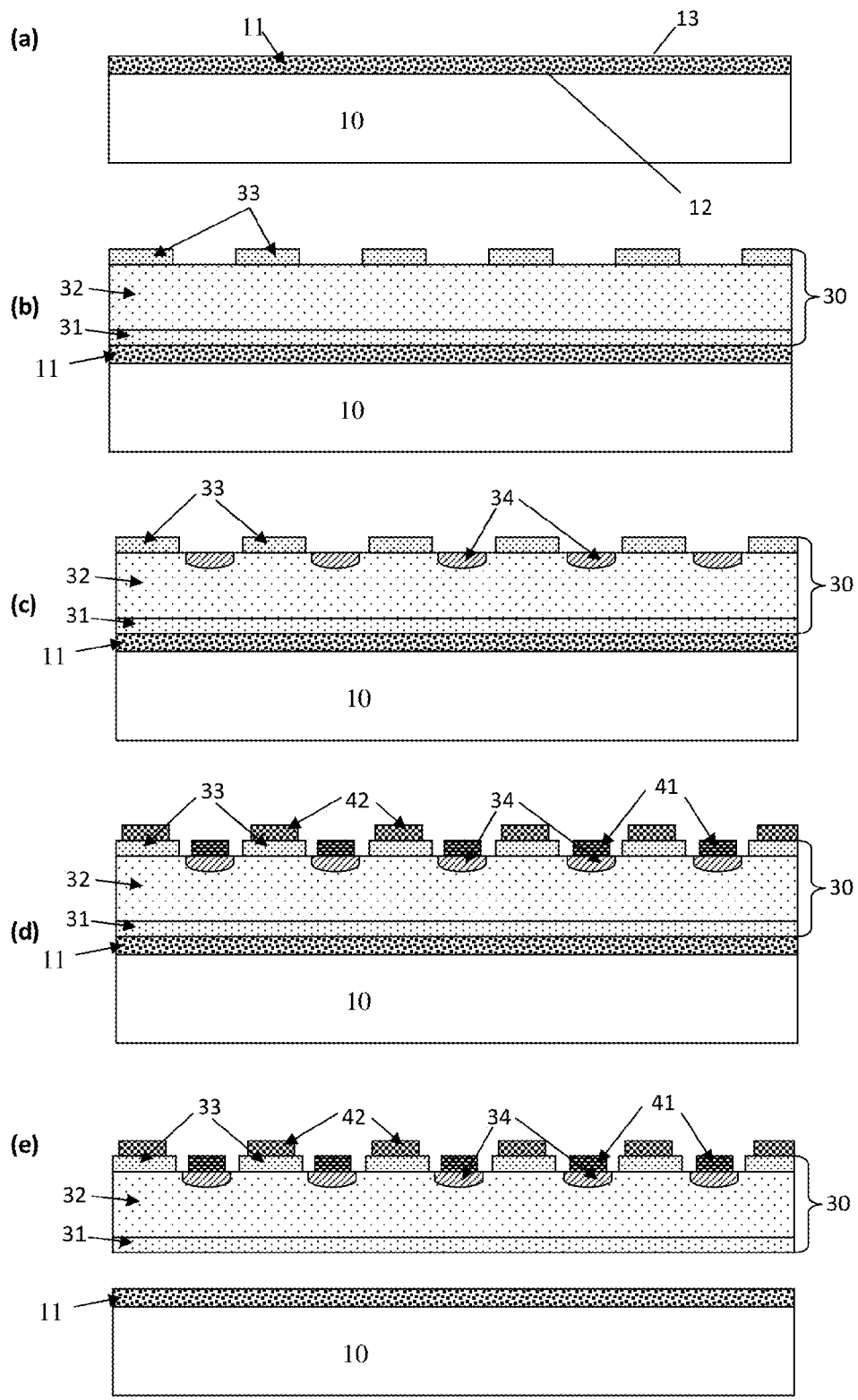
FIG. 2 schematically illustrates a method for fabricating thin semiconductor photovoltaic back contact cells according to an embodiment of the present invention.

A method according to one embodiment can also be used for fabricating back contact cells, i.e. cells having electrical contacts to n-type regions and to p-type regions at the back side of the cell. For example, the method can be used for fabricating interdigitated back contact (IBC) cells. This is illustrated in FIG. 2.

At a surface of a substrate 10, e.g. a high quality semiconductor, e.g. silicon, substrate or e.g. a low cost substrate such as for example a highly doped semiconductor, e.g. silicon, substrate, for example a $p^+$ type substrate with a doping concentration higher than about $5.10^{18}$ $cm^{-3}$, a thin porous layer 11 is formed (FIG. 2(a)) for example by means of an anodization process. During the anodization process, macro-pores are formed at the surface of the substrate 10. The porous layer 11 may be a thin layer having a thickness of less than about 3 micrometer, but the invention is not limited thereto. Any suitable porous layer thickness and any suitable degree of porosity of the porous layer known to a person skilled in the art can be used. The porosity of the porous layer 11 can be substantially the same throughout the layer or it can vary, e.g. in a thickness direction of the porous layer, i.e. in a direction perpendicular to a major surface of the substrate 10 onto which the porous layer is formed. For example, the porous layer 11 can have a graded porosity with a higher porosity at the interface 12 with the substrate 10 and a lower porosity towards the surface 13 of the porous layer away from the interface 12. In particular embodiments, the gradient in porosity from the interface 12 towards the surface 13 can be substantially continuous. In alternative embodiments, the variation in porosity from the interface 12 towards the surface 13 can be stepwise. For example, the porous layer 11 can comprise two or more sub-layers with different porosity, for example the porous layer 11 can comprise a first sub-layer with a first porosity and a second sub-layer with a second porosity on top of the first sub-layer, the second porosity being lower than the first porosity. As an example, the porosity of the first sub-layer can be in the range between about 40% and 60% and the porosity of the second sub-layer can be in the range between about 20% and 30%. The first sub-layer can for example have a thickness in the range between about 50 nm and 800 nm, for example between about 80 nm and 600 nm. The second sub-layer can for example have a thickness in the range between about 1000 nm and 1500 nm. However, the present invention is not limited thereto and other sub-layer thicknesses and porosities may be used.

Next a high-temperature (e.g. temperature >about 850° C.) treatment in $H_2$ is performed, resulting in removal of a native oxide and reorganization of the porous semiconductor, e.g. silicon, layer, wherein the porous layer may undergo a structural change into a quasi-crystalline layer with voids.

After the $H_2$ treatment, a stack 30 of semiconductor, e.g. silicon, layers is epitaxially grown on top of the porous layer 11, the semiconductor stack 30 being provided for forming the active part or active layer of a photovoltaic cell. This is schematically illustrated in FIG. 2(b) for an exemplary embodiment. In this exemplary embodiment, the stack 30 for example comprises a first epitaxial layer 31, a second epitaxial layer 32 and a third epitaxial layer 33 on top of one another. In the final photovoltaic cell which will be produced, the first epitaxial layer 31 is located at the front side of the photovoltaic cell and can be a front surface field layer, e.g. a $n^+$ type layer. The second epitaxial layer 32 can be a base layer, e.g. an n-type layer, of the photovoltaic cell. The thicknesses of the epitaxial layers 31, 32, 33 are such that the epitaxial layers are suitable for their intended purpose in the final device. The thickness of the second epitaxial layer 32 may be less than about 100 micrometer, for example less than about 50 micrometer, such as in the range between about 3 micrometer and 50 micrometer, e.g. between about 5 micrometer and 40 micrometer, for example between about 5 micrometer and 20 micrometer, for example between about 5 micrometer and 10 micrometer. The third epitaxial layer 33 can be a patterned $n^+$ layer, forming back surface field regions of the photovoltaic cell. The third epitaxial layer 33 can be patterned by selective growth at locations where a contact to the base region (second epitaxial layer 32) is to be formed (for example in a finger-like grid), e.g. using an oxide mask. Alternatively, the third epitaxial layer 33 can be grown first on the entire surface and can be selectively etched where a contact to an emitter region (to be formed further in the process) is to be provided, for example by a dry etching process or a wet etching process, using an appropriate mask. FIG. 2(b) schematically shows the structure obtained after epitaxial growth and structuring of the third epitaxial layer.

Next (FIG. 2(c)), rear side emitter regions 34 can be formed by performing a selective doping step, e.g. a p-type doping step, in the regions where the third epitaxial layer 33 is not present. The selective doping step can be done by any suitable means known to a person skilled in the art, such as for example by ion implantation, liquid source diffusion or solid source diffusion. Alternatively, p-type doped regions (emitter regions) can also be formed by selective epitaxial growth.

In one embodiment, the top surface of the epitaxial layer stack 30 corresponds to the back surface of the photovoltaic cell to be formed and the bottom side of the epitaxial layer stack 30 (i.e. the side adjacent to the porous layer 11) corresponds to the front surface of the photovoltaic cell to be formed. This is different from prior art methods, wherein the top surface of the epitaxial layer corresponds to the front surface of the photovoltaic cell.

In a subsequent step a contact layer of electrically conductive material, e.g. a metal layer, is provided on the epitaxial layer stack 30, as illustrated in FIG. 2(d). The contact layer can be provided by any suitable method known by a person skilled in the art, such as for example screen printing, evaporation or sputtering; any method having an inherent temperature step. In case the contact layer is a metal layer, it is a particularly advantageous embodiment if the metal layer is provided by screen printing, because the metal layer thickness and the higher temperatures used in a screen printing process as compared to other metallization processes may be beneficial for inducing sufficient stress for inducing lift-off of the epitaxial layers in a later stage of the process (as described below). When fabricating a back contact cell such as an IBC cell (as illustrated in FIG. 2), the contact layer is a patterned contact layer, e.g. a patterned metal layer, comprising a first type (patterned) conductive, e.g. metal, contact 41 to the (patterned) emitter region 34 and comprising a second type (patterned) conductive, e.g. metal, contact 42 to the (patterned) back surface field region 33. In such embodiments, the first type patterned conductive contact 41 and the second type patterned conductive contact 42 are electrically isolated from each other. This is illustrated in FIG. 2(d).

The epitaxial layer stack 30 has a first thermal coefficient of expansion $TCE_1$ and the contact layer 41, 42 has a second thermal coefficient of expansion $TCE_2$ different from, e.g. larger or smaller than, the first thermal coefficient of expansion $TCE_1$. Therefore, upon applying a temperature step, e.g. a temperature decrease or a temperature increase, depending on the type of difference between the first thermal coefficient of expansion $TCE_1$ and the second thermal coefficient of expansion $TCE_2$, a tensile stress is induced in the structure. As the porous layer 11 is the weakest layer of the structure shown in FIG. 2(d), the stress induced by the temperature step causes cracks in the porous layer 11, leading to a separation or lift-off of the epitaxial layer stack 30 (including the contact layers 41 and 42) from the substrate 10. This is illustrated in FIG. 2(e). When using a screen printing process for providing the contact layer 41, 42, the temperature step causing lift-off can be the firing step of the screen printing process, wherein a tensile stress is induced in the porous layer 11 during cooling down.

Although in the example shown FIG. 2(e) an embodiment is shown wherein the separation of the epitaxial stack 30 from the substrate 10 occurs at the interface between the epitaxial stack 30 and the porous layer 11 (wherein the porous layer 11 remains attached to the substrate 10), the separation may also occur at another location, for example between the substrate 10 and the porous layer 11, or inside the porous layer 11 at a location of highest porosity. In that case a part of the porous layer 11 (for example a part having high porosity) may remain attached to the substrate 11 and another part of the porous layer 11 (for example a part having lower porosity) may be lifted off and may remain attached to the epitaxial stack 30.

The substrate 10 can be reused, e.g. in a process according to one embodiment.

After removing the epitaxial stack 30 (including the conductive, e.g. metal, contacts 41, 42) from the substrate 10, additional (optional) process steps can be performed to finalize the photovoltaic cell, such as for example removal of remainders of the porous layer 11, front surface texturization, front surface passivation, or providing an antireflective coating.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of fabricating thin crystalline photovoltaic cells, the method comprising:
   providing a semiconductor substrate;
   forming a weakening layer in a surface portion of the substrate;
   epitaxially growing a stack of semiconductor layers on the substrate for forming an active layer of the photovoltaic cell, the semiconductor layers of the stack having a first thermal coefficient of expansion;
   depositing on the stack of semiconductor layers patterned back contacts for forming electrical contacts of the photovoltaic cell, the patterned back contacts having a second thermal coefficient of expansion different from the first thermal coefficient of expansion; and
   subsequent to depositing the patterned back contacts, generating a temperature change comprising heating the substrate, the stack of semiconductor layers, and the patterned back contacts to a temperature higher than about 600° C., wherein the temperature change induces a tensile stress in the weakening layer that directly causes cracks in the weakening layer and a lift-off that completely separates the substrate and a structure comprising the stack of semiconductor layers and the patterned back contacts.

2. A method according to claim 1, wherein forming a weakening layer comprises forming a porous layer at the surface of the substrate.

3. A method according to claim 2, wherein forming a porous layer is done by etching or by anodization.

4. A method according to claim 2, wherein forming a porous layer comprises forming a porous layer having a thickness, wherein the porosity varies in a direction of the thickness, with a higher porosity at an interface with the substrate and a lower porosity towards the surface.

5. A method according to claim 4, wherein forming a porous layer comprises forming a porous layer with a substantially continuous variation in porosity.

6. A method according to claim 4, wherein forming a porous layer comprises forming a porous layer comprising two or more sub-layers with different porosity.

7. A method according to claim 1, wherein forming a weakening layer comprises performing an ion implantation.

8. A method according to claim 1, wherein epitaxially growing a stack of semiconductor layers for forming the active layer of the photovoltaic cell comprises:
   growing a first epitaxial layer for forming an emitter layer of the photovoltaic cell;
   growing a second epitaxial layer for forming a base layer of the photovoltaic cell; and
   growing a third epitaxial layer for forming a back surface field.

9. A method according to claim 1, wherein epitaxially growing a stack of semiconductor layers for forming the active layer of the photovoltaic cell comprises:
   growing a first epitaxial layer for forming a front surface field;
   growing a second epitaxial layer for forming a base layer; and
   growing a third epitaxial layer for forming a back surface field and/or for forming an emitter region of the photovoltaic cell.

10. A method according to claim 9, the method further comprising patterning the third epitaxial layer.

11. A method according to claim 1, wherein depositing patterned back contacts comprises screen printing a patterned metal layer.

12. A method according to claim 1, wherein generating a temperature change to a temperature higher than about 600° C. comprises performing a metal firing process.

13. A method according to claim 1, the method further comprising, after lift-off, performing additional process to finalize the photovoltaic cells.

14. A thin crystalline photovoltaic cell fabricated by a method according to claim 1.

15. A method of fabricating thin crystalline photovoltaic cells, the method comprising:
   forming a weakening layer in a surface portion of a semiconductor substrate;
   epitaxially growing an active semiconductor layer of the photovoltaic cells on the substrate, the active layer having a first thermal coefficient of expansion;

depositing on the active layer patterned back contacts, the patterned back contacts having a second thermal coefficient of expansion different from the first thermal coefficient of expansion; and subsequent to depositing the patterned back contacts, generating a change in temperature comprising heating the substrate, the active layer, and the patterned back contacts to a temperature higher than about 600° C., wherein the change in temperature induces a tensile stress in the weakening layer that directly causes cracks in the weakening layer and a lift-off that completely separates the active layer and the patterned back contacts from the substrate.

16. A method according to claim 15, wherein forming a weakening layer comprises forming a porous layer at the surface of the substrate.

17. A method according to claim 16, wherein forming a porous layer is done by etching or by anodization.

18. A method according to claim 15, wherein forming a weakening layer comprises performing an ion implantation.

19. A method according to claim 15, wherein depositing a patterned back contacts comprises screen printing a patterned metal layer.

20. A method according to claim 15, wherein generating a temperature change comprises performing a metal firing process at a temperature in a range between about 700° C. and about 950° C.

* * * * *